(12) United States Patent
Sun et al.

(10) Patent No.: US 12,348,188 B2
(45) Date of Patent: Jul. 1, 2025

(54) FEEDFORWARD CANCELLATION CIRCUIT

(71) Applicant: Apple Inc., Cupertino, CA (US)

(72) Inventors: Bo Sun, Carlsbad, CA (US); Jafar Savoj, Menlo Park, CA (US); Sanjeev K. Maheshwari, Fremont, CA (US)

(73) Assignee: APPLE INC., Cupertino, CA (US)

( * ) Notice: Subject to any disclaimer, the term of this patent is extended or adjusted under 35 U.S.C. 154(b) by 63 days.

(21) Appl. No.: 18/359,576

(22) Filed: Jul. 26, 2023

(65) Prior Publication Data

US 2025/0038706 A1    Jan. 30, 2025

(51) Int. Cl.
H03B 5/12          (2006.01)

(52) U.S. Cl.
CPC ................... H03B 5/1206 (2013.01)

(58) Field of Classification Search
CPC .. H03B 5/1206; H03B 5/1212; H03B 5/1215; H03B 5/1228; H03B 5/1296; H03B 5/1265; H03B 2200/0074; H03B 2200/007; H03B 2200/009
See application file for complete search history.

(56) References Cited

U.S. PATENT DOCUMENTS

| | | | |
|---|---|---|---|
| 7,489,192 B2 | 2/2009 | Vitzilaios et al. | |
| 7,596,364 B2 | 9/2009 | Sjöland | |
| 8,723,609 B2 * | 5/2014 | Chang | H03B 5/1228 331/177 V |
| 9,484,879 B2 | 11/2016 | Baker et al. | |
| 9,774,259 B1 | 9/2017 | Ikriannikov et al. | |
| 10,554,177 B2 | 2/2020 | Lyalin et al. | |
| 10,651,856 B2 * | 5/2020 | Shiraishi | H03B 27/00 |
| 11,095,334 B1 | 8/2021 | Mohammadnezhad et al. | |
| 11,646,700 B2 | 5/2023 | Akhtar et al. | |
| 2009/0289727 A1 * | 11/2009 | El Rai | H03B 5/1243 331/46 |
| 2020/0336160 A1 * | 10/2020 | Krishnasamy Maniam | H03K 21/00 |
| 2021/0391826 A1 * | 12/2021 | Shin | H03B 5/1296 |

OTHER PUBLICATIONS

Zhao, Junlei, "Insights into Wideband PAs for High Speed mm-Wave Transceivers," (Doctoral Dissertation, Universitá degli Studi di Pavia), 2014, pp. 1-138.
Grenmyr, Andreas, "Nanowire based mm-wave LNA and switch design for 5G & Satellite Communications," (Master's Thesis, Lund University, 2020, pp. 1-67, Lund, Sweden.

* cited by examiner

*Primary Examiner* — Jeffrey M Shin
(74) *Attorney, Agent, or Firm* — Sterne, Kessler, Goldstein & Fox P.L.L.C

(57) ABSTRACT

The present disclosure describes a circuit that includes a first inductor circuit, a second inductor circuit, a first capacitor circuit, and a second capacitor circuit. The first inductor circuit includes a first inductor and a first driver circuit. The second inductor circuit includes a second inductor and a second driver circuit. The first inductor circuit operates at a first frequency. The second inductor operates at a second frequency. The first capacitor circuit provides a first signal to the second inductor circuit to adjust a first magnetic coupling generated by the first inductor circuit. The second capacitor circuit provides a second signal to the first inductor circuit to adjust a second magnetic coupling generated by the second inductor circuit.

20 Claims, 7 Drawing Sheets

FEEDFORWARD CANCELLATION CIRCUIT

FIELD

This disclosure relates to a feedforward circuit and, more particularly, to a feedforward cancellation circuit used for cancelling undesirable coupling between inductors.

BACKGROUND

As electronic devices are made smaller and more closely spaced, disruptive coupling interactions between electronic components can increase accordingly. For example, on-chip inductor-capacitor (LC) oscillators are a foundational building block for integrated circuit (IC) technology, which can implement multiple oscillators on the same die. To save die space, the oscillators can be closely spaced. Due to the nature of magnetic and electrical coupling of inductors, oscillators can exhibit undesirable characteristics, such as a "pulling" effect, when their operating frequency offset is small. As a result, designing closely-spaced oscillators can be challenging.

SUMMARY

Embodiments of the present disclosure include a circuit having first and second inductor circuits, and first and second capacitor circuits. The first inductor circuit includes a first inductor and a first driver circuit to drive the first inductor. The first inductor operates at a first frequency. The second inductor circuit includes a second inductor and a second driver circuit to drive the second inductor. The second inductor circuit operates at a second frequency different from the first frequency. The first capacitor circuit provides a first signal to the second inductor circuit to adjust a first magnetic coupling generated by the first inductor circuit. The second capacitor circuit provides a second signal to the first inductor circuit to adjust a second magnetic coupling generated by the second inductor circuit.

Embodiments of the present disclosure include a system having first and second oscillator devices, a power device, and first and second capacitor devices. The first oscillator device includes a first winding and a first capacitance structure. The first oscillator device operates at a first frequency. The second oscillator device includes a second winding and a second capacitance structure. The second oscillator device operates at a second frequency different from the first frequency. The power device is coupled to the first oscillator device and the second oscillator device. The first capacitor device provides a first feedforward signal to the second oscillator circuit. The second capacitor device provides a second feedforward signal to the first oscillator circuit.

Embodiments of the present disclosure include a method that uses feedforward neutralization signals to prevent undesirable coupling between inductors. The method includes driving a first wire coil of a first inductor circuit using an oscillatory driving signal at a first frequency. A magnetic coupling between the first inductor circuit and a second inductor circuit corresponds to the driving of the first wire coil. The method also includes driving a second wire coil of the second inductor circuit using a second oscillatory driving signal at a second frequency different from the first frequency. The method also includes providing, from a capacitor circuit, a cancellation signal to the second inductor circuit to adjust the magnetic coupling. The method also includes adjusting one or more properties of the cancellation signal to adjust the magnetic coupling.

BRIEF DESCRIPTION OF THE DRAWINGS

Embodiments of the present disclosure are best understood from the following detailed description when read with the accompanying figures. It is noted that, according to the standard practice in the industry, various features are not drawn to scale. Features of the present disclosure can be illustrated having larger and/or smaller dimensions for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
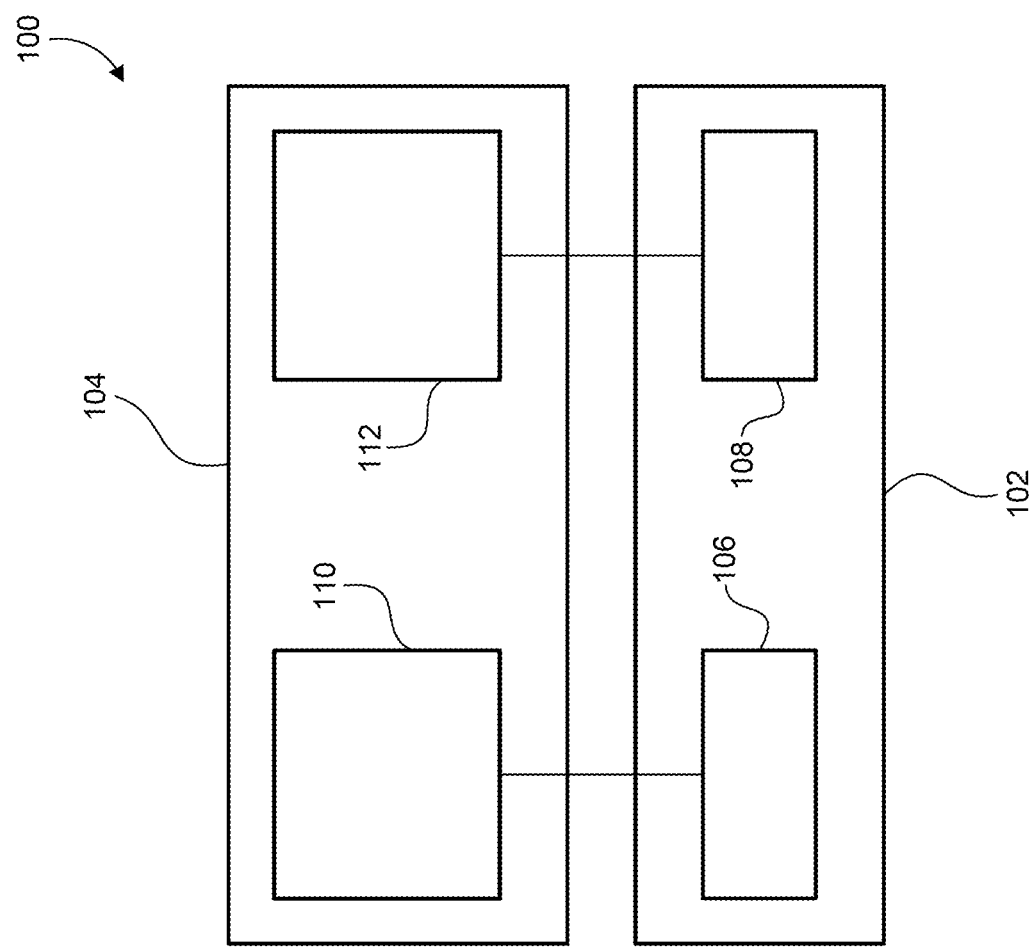
FIG. 1 shows an illustration of an electronic system, according to some embodiments.

The following disclosure provides different embodiments, or examples, for implementing different features of the provided subject matter. Specific examples of components and arrangements are described below to simplify the present disclosure. These are merely examples and are not intended to be limiting. The present disclosure can make use of reoccurring reference numerals and/or letters in the various examples. This repetition is for the purpose of simplicity and clarity and, unless indicated otherwise, does not in itself indicate a limiting relationship between the various embodiments and/or configurations discussed.

It is noted that references in the specification to "one embodiment," "an embodiment," "an example embodiment," "exemplary," and the like, indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

In the description of at least some embodiments herein, enumerative adjectives (e.g., "first," "second," "third," or the like) can be used to distinguishing like elements without establishing an order, hierarchy, quantity, or permanent numeric assignment (unless otherwise noted). For example, the terms "first power source" and "second power source" can be used in a manner analogous to "$i^{th}$ power source" and "$j^{th}$ power source" so as to facilitate identification of two or more power sources without specifying a particular order, hierarchy, quantity, or immutable numeric correspondence.

It is to be understood that the phraseology or terminology herein is for the purpose of description and not of limitation, such that the terminology or phraseology of the present specification is to be interpreted by those skilled in relevant art(s) in light of the teachings herein.

The following disclosure describes embodiments directed to minimizing interference between two or more inductor oscillators placed in proximity of one another. When it is desired for oscillators to operate independently from one another, mutual inductance can cause inductors in the vicinity of one another to electrically and/or magnetically couple to one another. Undesirable coupling can be mitigated using the systems, devices, and functions described herein to generate a feedforward signal that counters the undesirable coupling.

FIG. 1 shows an illustration of an electronic system 100, according to some embodiments. Electronic system 100 includes a power device 102 and a circuit device 104. Power device 102 includes multiple power sources (e.g., a first power source 106 and a second power source 108). First power source 106 and second power source 108 can include, for example, batteries, power supplies, power grid sources, photovoltaic sources, or the like. In some embodiments, power device 102 is a power management integrated circuit, or power management unit of electronic system 100.

In some embodiments, circuit device 104 can include any suitable type of electronic device, such as a processor circuit, a memory circuit, an input/output (I/O) circuit, a peripheral circuit, a radio frequency (RF) circuit, a near-field communication (NFC) circuit, an on-chip circuit, an on-chip LC oscillator, or combinations thereof. Circuit device 104 can be implemented on an integrated circuit device or system, in a system-on-chip, or the like. For example, circuit device 104 includes a first inductor circuit 110 (or first oscillator) and a second inductor circuit 112 (or second oscillator), which can be used for RF applications. In some embodiments, circuit device 104 may be implemented in a chiplet, such as a reduced functionality integrated circuit mounted on or adjacent to a system-on-chip.

In some embodiments, power device 102 can provide electrical power to circuit device 104. Power device 102 can be coupled to first inductor circuit 110 and second circuit device 110. One or more power sources can be used to provide power to first inductor circuit 110 and second inductor circuit 112. In some embodiments, first power source 106 can provide power to first inductor circuit 110 and second power source 108 can provide power to second inductor circuit 112.

Figure 2:
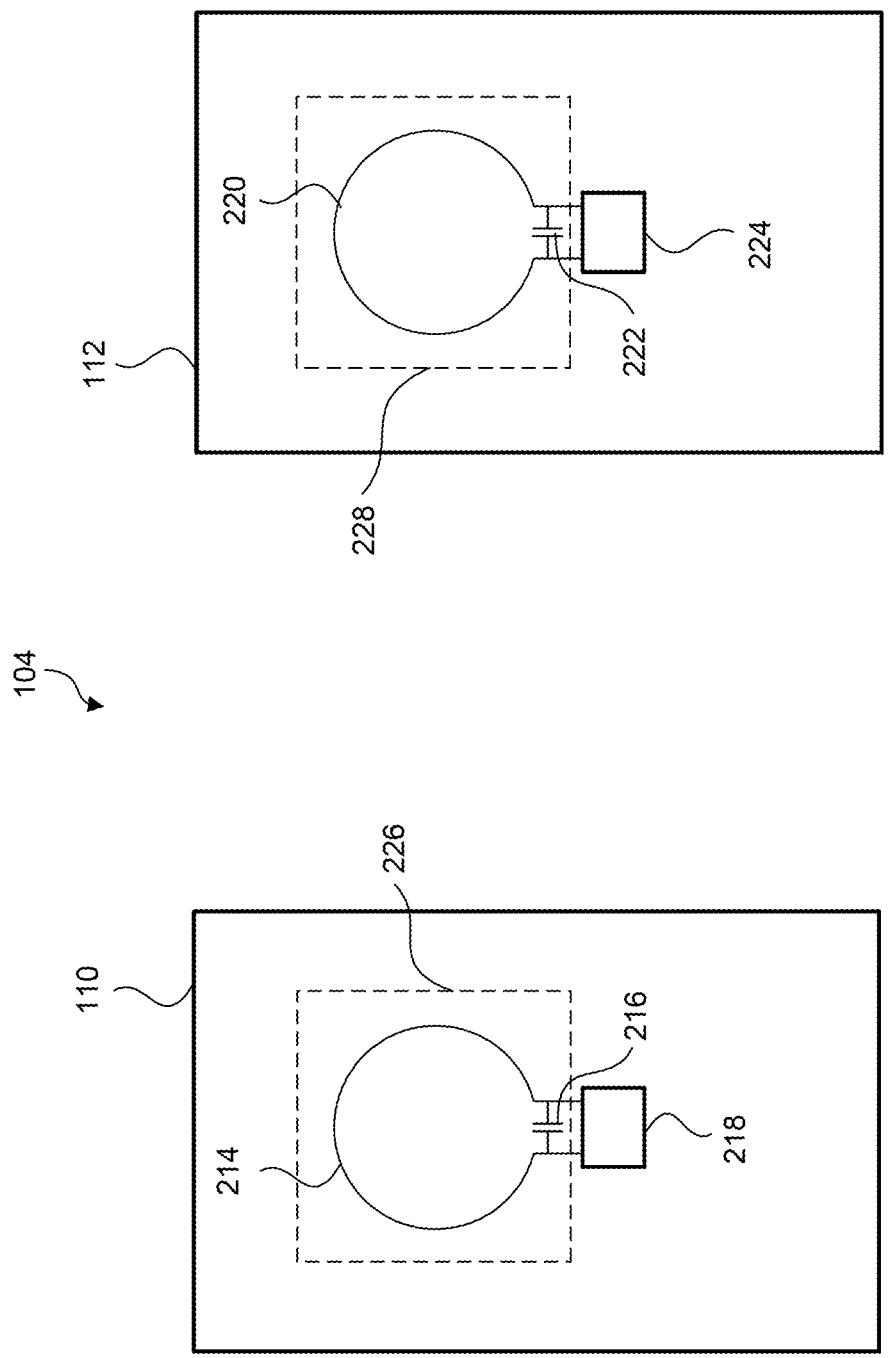
FIG. 2 shows an illustration of a circuit-level representations of a portion of a circuit device, according to some embodiments.

FIG. 2 shows an illustration of a circuit-level representation of a portion of circuit device 104 of FIG. 1, according to some embodiments. Specifically, FIG. 2 shows a circuit-level representation of first inductor circuit 110, second inductor device 112, and electrical connections therein.

In some embodiments, first inductor circuit 110 includes a first inductor 214, a first capacitance structure 216, and a first driver circuit 218. Second inductor circuit 112 includes a second inductor 220, a second capacitance structure 222, and a second driver circuit 224. It is to be appreciated that circuit structures like inductor structures and capacitance structures can be implemented according to any number of different designs. For example, an inductor can include a winding of wire, a wire coil, a zig-zag pattern of wire, or the like. A winding, coil, or zig-zag pattern can include one or more repetitions (e.g., one or more turns, one or more revolutions, or the like). A capacitor can include a pair of conductor plates, a pair of interconnects or wires, interdigitated conductor structures, or the like. Circuit structures can be implemented on a printed circuit board or other support structures.

In some embodiments, first driver circuit 218 can receive power from power device 102 (e.g., from first power source 106 of FIG. 1). First driver circuit 218 can drive first inductor 214. First inductor 214 and first capacitance structure 216 can be implemented as a first LC oscillator. Hence, first driver circuit 218 can drive the first LC oscillator. A similar description relationship applies to second driver circuit 224, second power source 108 (FIG. 1), second inductor 220, and second capacitance structure 222 (with a second LC oscillator implemented as second inductor 220 and second capacitance structure 222).

In some embodiments, one or more driver circuits (e.g., first driver circuit 218 and second driver circuit 224) can convert a source of incoming power (e.g., a battery or other suitable power supply source) to desired voltage/current characteristics of circuit device 104. Non-limiting examples of functions of driver circuits can include AC/DC or DC/AC conversion, voltage division or amplification, phase adjustment, frequency selection, or the like.

In some embodiments, first inductor circuit 110 and second inductor circuit 112 can be oscillators that are driven at, for example, RF frequencies or speeds (e.g., for 5G radiofrequency communication). First inductor circuit 110 and second inductor circuit 112 can be disposed close to one another to save on device footprint (e.g., device miniaturization). A drawback of this circuit arrangement is that such close proximity can generate magnetic and/or electrical coupling of the inductor circuits. In some embodiments, first inductor circuit 110 can be operated at a first frequency and second inductor circuit 112 can be operated at a second frequency different from the first frequency. A problem can arise if the first and second operating frequencies are close, but nonetheless functionally different (e.g., two frequency channels with an offset of about 5% or less). Due to the nature of magnetic and electrical coupling of inductors, the inductor circuits can exhibit an undesirable "pulling" effect (e.g., undesirable synchronization, where a first oscillator can cause a nearby second oscillator to operate at a non-intended frequency). It is desirable to eliminate, or otherwise vastly reduce, inductive coupling between first inductor circuit 110 and second inductor circuit 112. To mitigate the "pulling" effect, first inductor circuit 110 can be disposed far from second inductor circuit 112. But, as explained above, limited space in electronic devices can hinder efforts to isolate first inductor circuit 110 and second inductor circuit 112. Therefore, first inductor circuit 110 and second inductor circuit 112 can be arranged with a shielding structure therebetween. In some embodiments, first inductor circuit 110 and/or second inductor circuit 112 can include a guard ring to cancel a portion of the undesirable coupling. A first guard ring 226 and a second guard ring 228 are functionally represented as dashed lines in FIG. 2. Additional and/or alternative mitigation measures are further disclosed herein.

Figure 3:
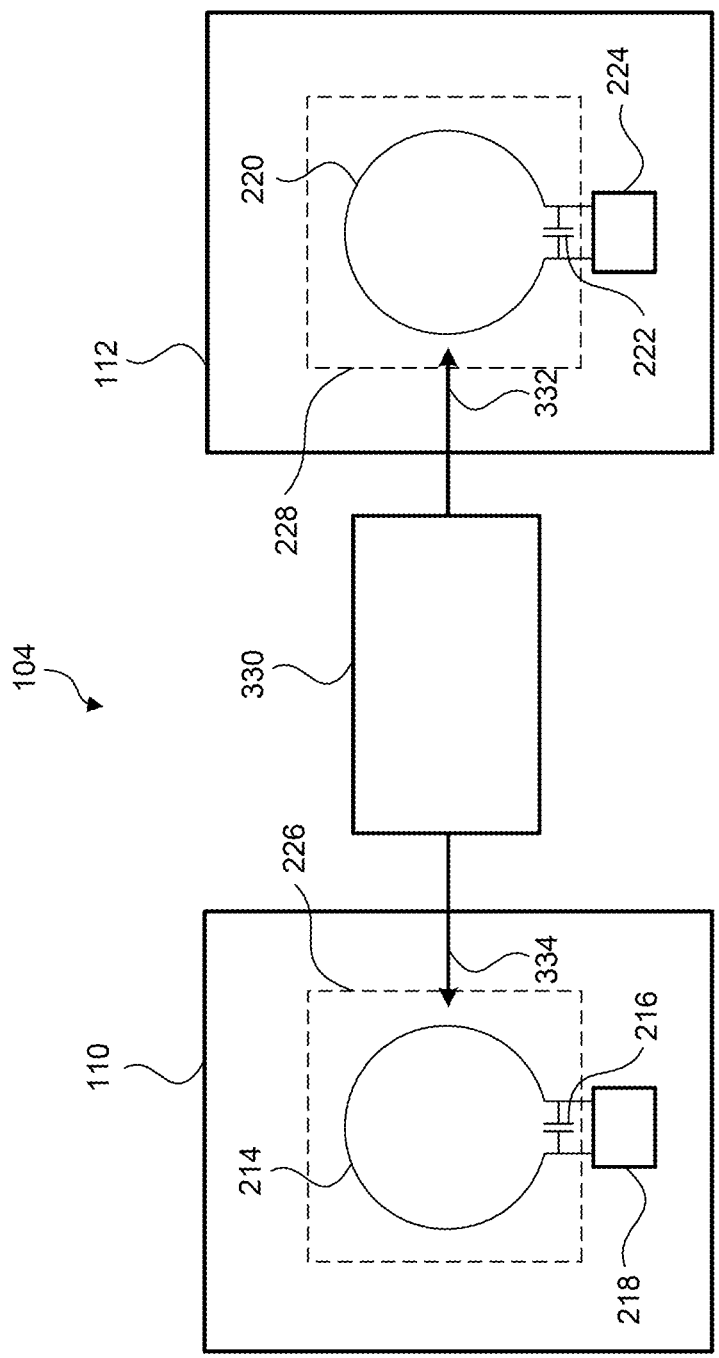
FIG. 3 shows an illustration of a circuit-level representation of a circuit device, according to some embodiments.

FIG. 3 shows an illustration of a circuit-level representation of circuit device 104 of FIG. 1 showing additional details, according to some embodiments. Unless otherwise noted, the structures and functions of commonly numbered elements in FIGS. 1-3 are described above. While guard rings 226 and 228 in FIG. 2 can reduce electrical coupling between inductor circuits, the guard rings may not fully mitigate (or eliminate) magnetic coupling (e.g., mutual inductance) between first inductor circuit 110 and second inductor circuit 120.

To mitigate the magnetic and/or electrical coupling, in some embodiments, circuit device 104 can include additional control(s) and/or circuit(s). Circuit device 104 can include a coupling cancellation system 330 for sensing the magnetic and/or electrical coupling generated by the inductor circuits and for generating a first signal 332 and a second signal 334 (e.g., feedforward cancellation/neutralization signals) to reduce the magnetic and/or electrical coupling. Circuit device 104 can include one or more capacitor circuits to generate feedforward cancellation signals. Circuit device 104 can include one or more control devices to adjust one or more properties of the feedforward cancellation signal(s) to reduce the magnetic and/or electrical coupling. The electrical coupling is an electrical component of the wireless inductive coupling (e.g., over air or free space) between first inductor 214 and second inductor 220—where there is no material connection (e.g., wire) between first inductor 214 and second inductor 220—while the magnetic coupling is a magnetic component of the inductive coupling.

Figure 4:
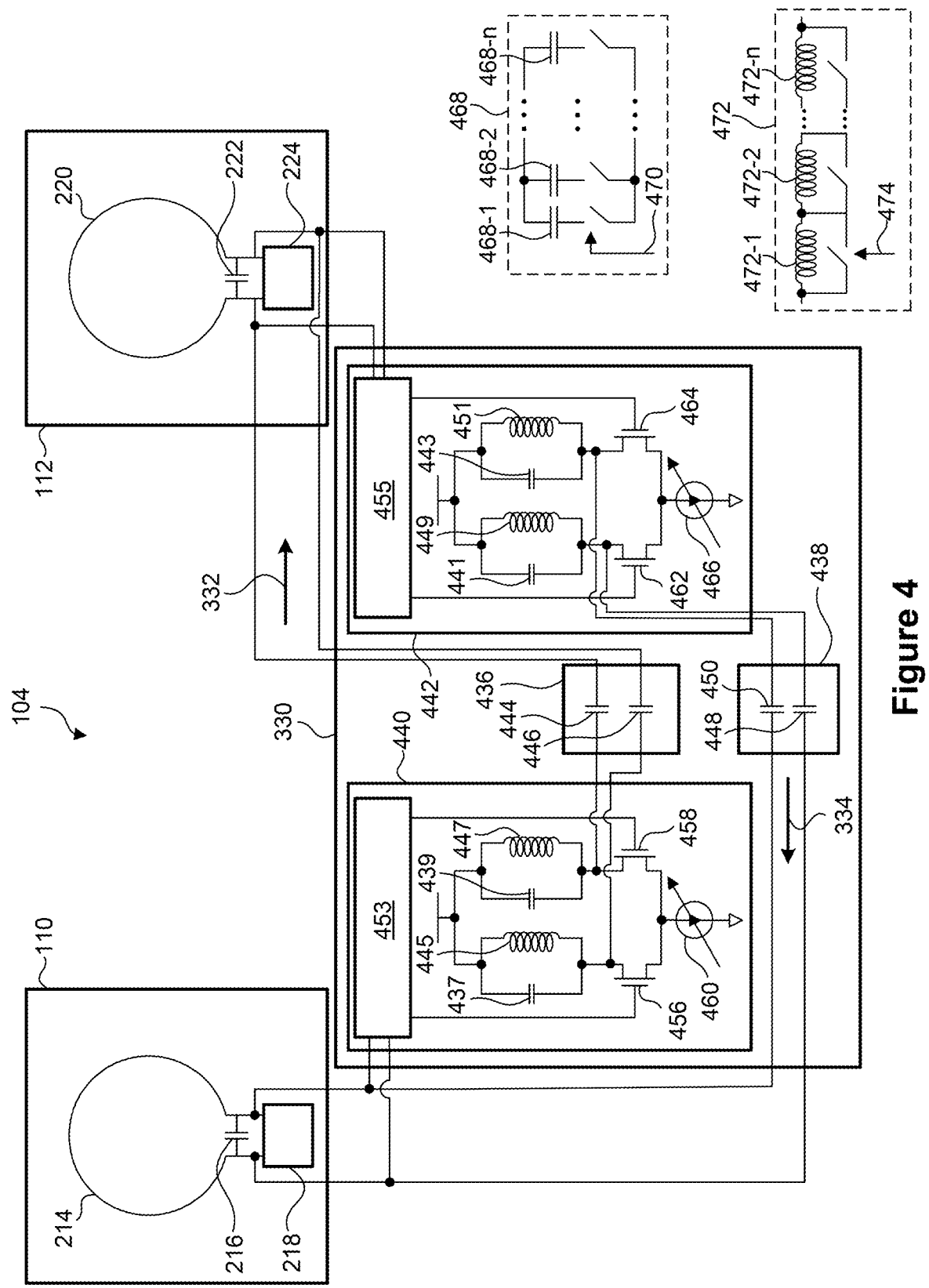
FIG. 4 shows an illustration of a circuit-level representation of a circuit device, according to some embodiments.

FIG. 4 shows an illustration of a circuit-level representation of circuit device 104 with a more detailed view of coupling cancellation system 330 (FIG. 3), according to some embodiments. Unless otherwise noted, the structures and functions of commonly numbered elements in FIGS. 1-4 are described above.

In some embodiments, circuit device 104 includes a first capacitor circuit 436 and/or a second capacitor circuit 438 (also referred to as "first and second capacitor devices"). Circuit device 104 also includes a first control device 440 and/or a second control device 442. Additional capacitor circuits and control devices can be used when implementing additional inductor circuits. Furthermore, it is envisaged that capacitor circuits and control devices are not fixed at the shown locations (e.g., can be part of, or external to, the inductor circuits). It is also envisaged that similar elements can be collapsed or combined into fewer elements. For example, a single control device can perform the functions of first control device 440 and second control device 442.

In some embodiments, first capacitor circuit 436 can provide first signal 332 to second inductor circuit 112 to adjust a magnetic and/or electrical coupling generated by first inductor circuit 110 (e.g., a first magnetic coupling). First capacitor circuit 436 is coupled to first inductor circuit 110. First capacitor circuit 436 can sense the first magnetic and/or electrical coupling and generate first signal 332 based on the sensed first magnetic and/or electrical coupling. First signal 332 can be used as a feedforward cancellation signal to mitigate the effects of the first magnetic and/or electrical coupling.

Second capacitor circuit 438 can provide second signal 334 to first inductor circuit 110 to adjust a magnetic and/or electrical coupling generated by second inductor circuit 112 (e.g., a second magnetic and/or electrical coupling). Second capacitor circuit 438 is coupled to second inductor circuit 112. Second capacitor circuit 438 can sense the second magnetic and/or electrical coupling and generate second signal 334 based on the sensed second magnetic and/or electrical coupling. Second signal 334 can be used as a feedforward signal to mitigate the effects of the second magnetic and/or electrical coupling.

In some embodiments, first capacitor circuit 436 and second capacitor circuit 438 can be passive capacitor circuits (e.g., without active management of first signal 332 and second signal 334). Passive capacitor circuits can provide feedforward cancellation signals, but may not be able to completely suppress magnetic coupling. To explain in an alternate qualitative manner, let the magnetic coupling be represented by a normalized, unitless quantity "$-j$" (alternatively, or additionally, applies to electrical coupling). Passively implemented capacitor circuits can provide a feedforward cancellation signal with the effect of "$+j+\alpha$." While the "$+j$" contribution from the passive capacitor circuits is able to cancel the "$-j$" contribution of the magnetic coupling, the structure of the passive capacitor circuits can give rise to an undesirable extra term "$+\alpha$." It can be difficult to design passive capacitor circuits for which the extra term "$+\alpha$" is zero.

In some embodiments, first control device 440 can adjust one or more properties of first signal 332 such that the contribution of first signal 332 is offset by "$-\alpha$." Therefore, the actively managed first signal 332 can cancel the contribution of the first magnetic coupling "$-j$" by an appropriate amount (e.g., "$j+\alpha-\alpha=j$"). Likewise, second control device 442 can adjust one or more properties of second signal 334 to adjust the second magnetic coupling by a given amount. The one or more properties of first signal 332 and second signal 334 can include a phase, an amplitude, a frequency, or the like. First control device 440 and second control device 442 can adjust amplitude, phase, frequency, the like, or any combination thereof (e.g., one or more of a phase and an amplitude (phase, amplitude, or both)) to reduce the first and/or second magnetic coupling.

In some embodiments, first control device 440 and second control device 442 include circuit elements for adjusting the one or more properties of first signal 332 and second signal 334 (e.g., inductors, capacitors, phase inverters, or the like). In some embodiments, first control device 440 and second control device 442 include selectable capacitor circuits 437, 439, 441, and/or 443 (e.g., parallel capacitors) and/or selectable inductor circuits 445, 447, 449, and/or 451 (e.g., serial inductors) that can be selected (e.g., connected or disconnected via switches). In some embodiments, first control device 440 includes phase inverter 453 to adjust a phase of first signal 332 by inverting the phase. Second control device 442 includes phase inverter 455 to adjust a phase of second signal 334 by inverting the phase. The phases of first signal 332 and/or second signal 334 can depend on an impedance of the inductor-capacitor (LC) circuits formed by selectable capacitor circuits 437, 439, 441, and 443 and selectable inductor circuits 445, 447, 449, and 451. The phases of first signal 332 and/or second signal 334 can be shifted in one direction via capacitance, whereas the phases can be shifted in the opposite direction via inductance. As capacitors and inductors are connected or disconnected in first control device 440 and second control device 442, impedance is adjusted, thereby adjusting the phases.

In some embodiments, each of selectable capacitor circuits 437, 439, 441, and 443 includes a capacitor bank 468. In some embodiments, capacitor bank 468 includes two or more selectable capacitors, for example, a selectable capacitor 468-1 up to a selectable capacitor 468-$n$ ($n \geq 2$). The selectable capacitors can be selected independently via a switch signal 470 generated by first control device 440 or second control device 442. Capacitance is adjusted as selectable capacitors are included or excluded from the overall circuit, thereby allowing adjustment of the phases of signals as explained above.

In some embodiments, each of selectable inductor circuits 445, 447, 449, and 451 includes an inductor bank 472. In some embodiments, a group of inductors 472 can include two or more selectable inductors, for example, a selectable inductor 472-1 up to a selectable inductor 472-$n$ (n≥2). The selectable inductors can be selected independently via a switch signal 474 generated by first control device 440 or second control device 442. Inductance is adjusted as selectable inductors are included or excluded from the overall circuit, thereby allowing adjustment of the phases of signals as explained above.

In some embodiments, first control device 440 and second control device 442 include amplifier(s) (e.g., bias current amplifiers) to adjust an amplitude of first signal 332 and/or an amplitude of second signal 334. A current amplifier of first control device 440 can include a transistor 456, a transistor 458, and an adjustable current source 460. The gates of transistors 456 and 458 can sense a voltage difference (e.g., differential amplifier), causing transistors 456 and 458 to output an amplified version of the signal received at the gates. The gates of transistors 456 and 458 can be controlled by phase inverter 453 or by the terminals of first inductor 214. In this manner, the signal from first control device 440 to first capacitor circuit 436 can have an adjustable amplitude. As a result, the amplitude of first signal 332 is adjustable. Similarly, a current amplifier of second control device 442 can include a transistor 462, a transistor 464, and an adjustable current source 466—the functions of which are envisaged as described in reference to first control device 440, transistor 456, transistor 458, and adjustable current source 466.

In some embodiments, first capacitor circuit 436 includes a first capacitor 444 and a second capacitor 446. First capacitor 444 can be coupled to first control device 440. First capacitor 444 can also be coupled to second inductor circuit 112 (e.g., coupled to a first terminal of second inductor 220). Second capacitor 446 can be coupled to first control device 440. Second capacitor 446 can also be coupled to second inductor circuit 112 (e.g., coupled to a second terminal of second inductor 220). The connection arrangement of first capacitor circuit 436 (receiving input from first inductor circuit 110 and sending a feedforward signal to second inductor circuit 112) and second capacitor circuit (receiving input from second inductor circuit 112 and sending a feedforward signal to first inductor circuit 110) can be described as a cross-coupled capacitor arrangement. Similarly, second capacitor circuit 438 includes a first capacitor 448 and a second capacitor 450. First capacitor 448 can be coupled to second control device 442. First capacitor 448 can also be coupled to first inductor circuit 110 (e.g., coupled to a first terminal of first inductor 214). Second capacitor 450 can be coupled to second control device 442. Second capacitor 450 can also be coupled to first inductor circuit 110 (e.g., coupled to a second terminal of first inductor 214).

Figure 5:
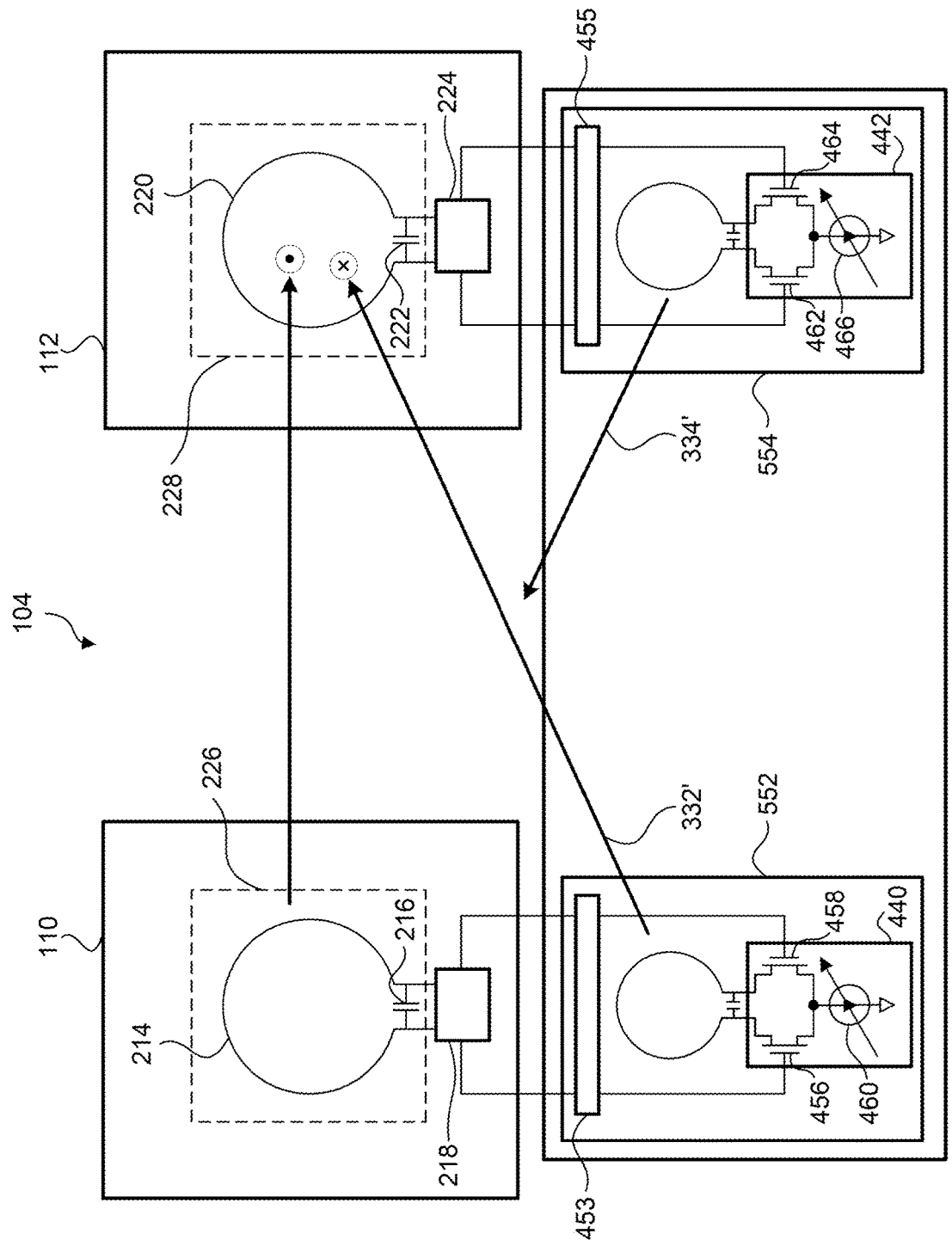
FIG. 5 shows an illustration of a circuit-level representation of circuit device, according to some embodiments.

FIG. 5 shows an illustration of a circuit-level representation of circuit device 104 having additional elements for generating magnetic fields, according to some embodiments. While the elements in FIG. 5 can work using a principle that is different from the techniques described in reference to FIGS. 2-4, unless otherwise noted, the structures and functions of commonly numbered elements in FIGS. 1-5 are described above.

In some embodiments, circuit device 104 also includes a third inductor circuit 552 and a fourth inductor circuit 554. Third inductor circuit 552 includes devices that function to provide a neutralization signal to second inductor circuit 112. Third inductor circuit 552 can include phase inverter 453 and first control device 440, which includes transistors 456 and 458 and current source 460. The structures and functions of phase inverter 453, first control device 440, transistors 456 and 458, and current source 460 are described above with reference to FIG. 4. Fourth inductor circuit 554 includes devices that function to provide a neutralization signal to first inductor circuit 110. Fourth inductor circuit 554 can include phase inverter 455 and second control device 442, which includes transistors 462 and 464 and current source 466. The structures and functions of phase inverter 455, second control device 442, transistors 462 and 464, and current source 466 are described above with reference to FIG. 4.

As before, in some embodiments, first inductor circuit 110 and second inductor circuit 112 can generate respective first and second magnetic coupling (undesirable) during operation. As a non-limiting example, a magnetic field symbol out of the page (black dot within a circle) denotes the first magnetic coupling (located within second inductor 220). To counter the first magnetic coupling, third inductor circuit 552 can provide a first magnetic signal 332' to second inductor circuit 112 to adjust the first magnetic coupling (e.g., combine the magnetic fields to cancel out). First signal 332' can take the form of an opposing magnetic field (represented by a magnetic symbol into the page (symbol 'x' within a circle), located within second inductor 220). Similarly, fourth inductor circuit 554 can provide a second magnetic signal 334' to first inductor circuit 112 to adjust the second magnetic coupling.

In some embodiments, third inductor circuit 552 is coupled to first inductor circuit 110 (e.g., via first control device 440). The driving signal from first driver circuit 218 can also be used to control the gates of transistors 456 and 458. In this manner, third inductor circuit 552 can sense the first magnetic coupling generated by first inductor circuit 110. First control device 440 can adjust one or more properties of first magnetic signal 332', which can be a feedforward neutralization signal. In some embodiments, first control device 440 can adjust an amplitude of first magnetic signal 332' by adjusting current source 460. Fourth inductor circuit 554 is coupled to second inductor circuit 112 (e.g., via second control device 442). The driving signal from second driver circuit 224 can be used to control the gates of transistors 462 and 464. In this manner, fourth inductor circuit 554 can sense the second magnetic coupling generated by second inductor circuit 112. Second control device 442 can adjust one or more properties of second magnetic signal 334', which can be a feedforward neutralization signal. In some embodiments, second control device 442 can adjust an amplitude of second magnetic signal 334' by adjusting current source 466. Phase inverters 453 and 455 can be implemented as described above in reference to FIG. 4.

In some embodiments, third inductor circuit 552 and fourth inductor circuit 554 can be disposed outside of a guard ring (see FIG. 2). Implementing guard rings around third inductor circuit 552 and fourth inductor circuit 554 can attenuate or otherwise adversely impact the functions of first magnetic signal 332' and second magnetic signal 334'. Therefore, disposing third inductor circuit 552 and fourth inductor circuit 554 outside of guard rings can maximize the effects of the counter magnetic flux generated by third inductor circuit 552 and fourth inductor circuit 554.

In some embodiments, the magnetic and/or electrical coupling cancellation techniques disclosed herein can be used to reduce magnetic and/or electrical coupling between oscillators by, for example, about 10 dB or more, about 20 dB or more, about 30 dB or more, or the like. The magnetic and/or electrical coupling reduction can be effective at operating frequencies of the oscillators, which can include, but are not limited to, RF range, 5G range (e.g., about 30-50 GHz), or the like.

Figure 6:
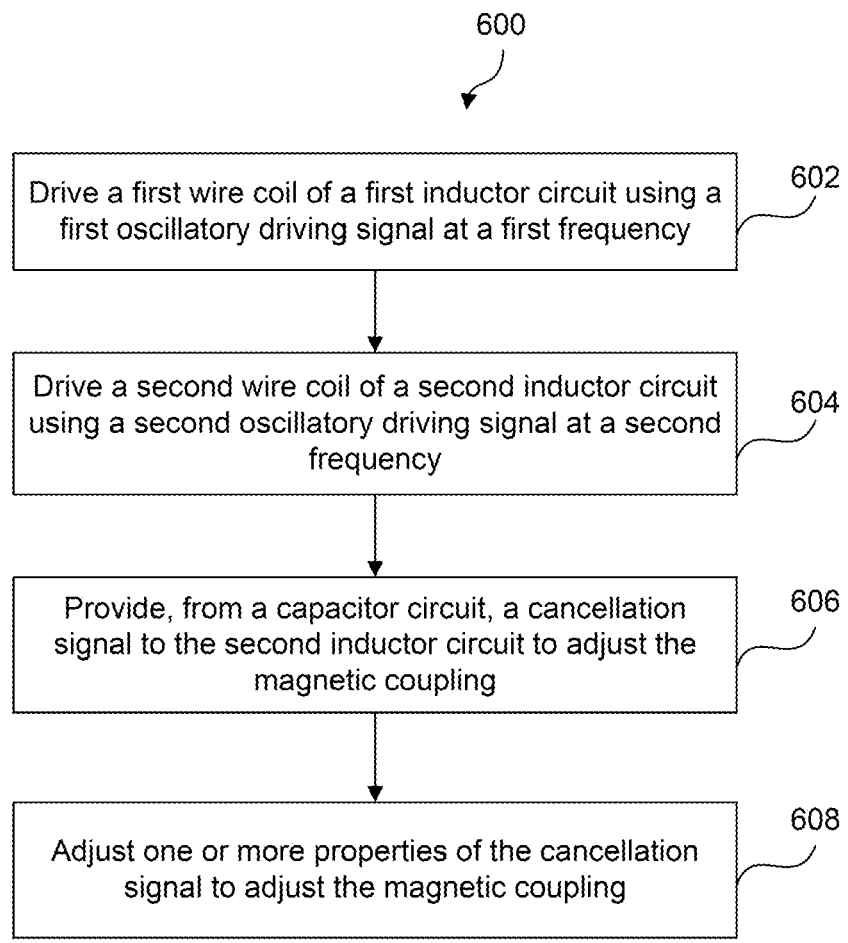
FIG. 6 shows a flowchart of a method that uses feedforward neutralization signals to prevent undesirable coupling between inductors, according to some embodiments.

FIG. 6 shows a flowchart of method 600, according to some embodiments. In some embodiments, method 600 can be performed using the device(s) described in reference to FIGS. 1-5. Other representations of the device(s) are within the scope of the present disclosure. Also, additional operations may be performed between various operations of method 600 and may be omitted merely for clarity and ease of description. The additional operations can be provided before, during, and/or after method 600, in which one or more of these additional operations are briefly described herein. Moreover, not all operations may be needed to perform the disclosure provided herein. Additionally, some of the operations may be performed simultaneously or in a different order than shown in FIG. 6. In some embodiments, one or more other operations may be performed in addition to or in place of the presently-described operations.

In some embodiments, at operation 602, first inductor 214 (e.g., first wire coil) of first inductor circuit 110 of FIGS. 2-5 is driven using an oscillatory driving signal. The oscillatory driving signal can be provided by first driver circuit 218. A magnetic coupling between first inductor circuit 110 and second inductor circuit 112 can correspond to the driving of first inductor 214.

In some embodiments, at operation 604, second inductor 220 (e.g., second wire coil) of second inductor circuit 112 of FIGS. 2-5 is driven using an other oscillatory driving signal at a second frequency different from the first frequency. The other oscillatory driving signal can be provided by second driver circuit 224.

In some embodiments, at operation 606, first signal 332 (e.g., cancellation signal) is provided from first capacitor circuit 436 to second inductor circuit 112 of FIGS. 2-4 to adjust the magnetic coupling. Similarly, first signal 332' can be provided from third inductor circuit 552 to second inductor circuit 112 of FIG. 5.

In some embodiments, at operation 608, one or more properties of first signal 332 (or first signal 332' as the case may be) is adjusted to adjust the magnetic coupling. First control device 440 can be used to adjust the one or more properties of first signal 332/332'. The one or more properties can include phase, an amplitude, a frequency, or the like. One or more of the phase and the amplitude can be adjusted to reduce the magnetic coupling. A phase of first signal 332 can be inverted using phase inverter 453 of FIGS. 4 and 5.

In some embodiments, another magnetic coupling between second inductor circuit 112 and first inductor circuit 110 can correspond to the driving of second inductor 220. Second signal 334 (e.g., another cancellation signal) is provided from second capacitor circuit 438 (e.g., another capacitor circuit) to first inductor circuit 110 of FIGS. 2-4 to adjust the other magnetic coupling. Similarly, second signal 334' can be provided from fourth inductor circuit 554 to first inductor circuit 110 of FIG. 5. One or more properties of second signal 334 (or second signal 334' as the case may be) is adjusted to adjust the other magnetic coupling. Second control device 442 can be used to adjust the one or more properties of second signal 334/334'. The one or more properties can include a phase, an amplitude, a frequency, or the like. One or more of the phase and the amplitude can be adjusted to reduce the other magnetic coupling. A phase of second signal 334 can be inverted using phase inverter 455 of FIGS. 4 and 5.

In some embodiments, the magnetic coupling can be sensed using first capacitor circuit 436. First signal 332/332' can be generated as a feedforward signal based on the sensing of the magnetic coupling. One or more capacitors 468-*n* of capacitor circuits 437 and 439 and one or more inductors 472-*n* of inductor circuits 445 and 447 can be selected to adjust a phase of first signal 332. One or more capacitors 468-*n* of capacitor circuits 441 and 443 and one or more inductors 472-*n* of inductor circuits 449 and 451 can be selected to adjust a phase of second signal 334. A current of current source 460 can be adjusted to adjust an amplitude of first signal 332. A current of current source 466 can be adjusted to adjust an amplitude of second signal 334.

Figure 7:
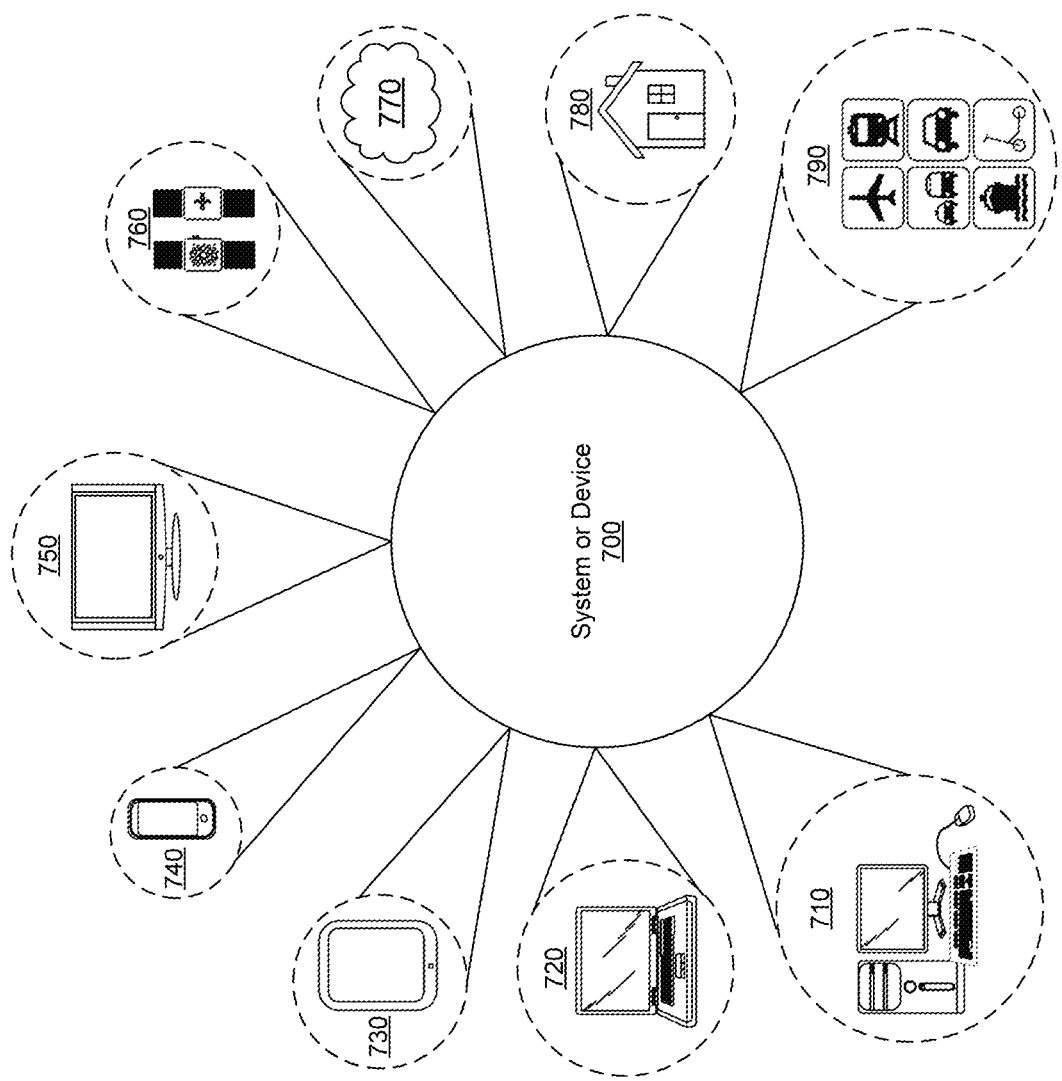
FIG. 7 shows an illustration of various exemplary systems or devices that can include the disclosed embodiments.

FIG. 7 shows an illustration of exemplary systems or devices that can include the disclosed embodiments. System or device 700 can incorporate one or more of the disclosed embodiments in a wide range of areas. For example, system or device 700 can be implemented in one or more of a desktop computer 710, a laptop computer 720, a tablet computer 730, a cellular or mobile phone 740, and a television 750 (or a set-top box in communication with a television).

Also, system or device 700 can be implemented in a wearable device 760, such as a smartwatch or a health-monitoring device. In some embodiments, the smartwatch can have different functions, such as access to email, cellular service, and calendar functions. Wearable device 760 can also perform health-monitoring functions, such as monitoring a user's vital signs and performing epidemiological functions (e.g., contact tracing and providing communication to an emergency medical service). Wearable device 760 can be worn on a user's neck, implantable in user's body, glasses or a helmet designed to provide computer-generated reality experiences (e.g., augmented and/or virtual reality), any other suitable wearable device, and combinations thereof.

Further, system or device 700 can be implemented in a server computer system, such as a dedicated server or on shared hardware that implements a cloud-based service 770. System or device 700 can be implemented in other electronic devices, such as a home electronic device 780 that includes a refrigerator, a thermostat, a security camera, and other suitable home electronic devices. The interconnection of such devices can be referred to as the "Internet of Things" (IoT). System or device 700 can also be implemented in various modes of transportation 790, such as part of a vehicle's control system, guidance system, and/or entertainment system.

The systems and devices illustrated in FIG. 7 are merely examples and are not intended to limit future applications of the disclosed embodiments. Other example systems and devices that can implement the disclosed embodiments include portable gaming devices, music players, data storage devices, and unmanned aerial vehicles.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first inductor circuit, comprising:
      a first inductor; and
      a first driver circuit configured to drive the first inductor, wherein the first inductor circuit is configured to operate at a first frequency;
   a second inductor circuit, comprising:
      a second inductor; and
      a second driver circuit configured to drive the second inductor, wherein the second inductor circuit is configured to operate at a second frequency different from the first frequency;
   a first capacitor circuit configured to provide a first signal to the second inductor circuit to adjust a first magnetic coupling generated by the first inductor circuit; and
   a second capacitor circuit configured to provide a second signal to the first inductor circuit to adjust a second magnetic coupling generated by the second inductor circuit.

2. The circuit of claim 1, wherein the first capacitor circuit is coupled to the first inductor circuit and is further configured to sense the first magnetic coupling and to generate the first signal as a feedforward neutralization signal based on the sensed first magnetic coupling.

3. The circuit of claim 1, further comprising a control device configured to adjust one or more properties of the first signal and the second signal to adjust the first magnetic coupling and the second magnetic coupling, respectively, wherein the one or more properties of the first signal comprises one or more of a phase and an amplitude and the control device is further configured to adjust the one or more of the phase and the amplitude to reduce the first magnetic coupling.

4. The circuit of claim 1, further comprising a control device configured to adjust one or more properties of the first signal and the second signal to adjust the first magnetic coupling and the second magnetic coupling, respectively, wherein the control device comprises a phase inverter configured to adjust a phase of the first signal, a phase of the second signal, or a combination thereof.

5. The circuit of claim 1, further comprising a control device configured to adjust one or more properties of the first signal and the second signal to adjust the first magnetic coupling and the second magnetic coupling, respectively, wherein the control device comprises a current amplifier to adjust an amplitude of the first signal, an amplitude of the second signal, or a combination thereof.

6. The circuit of claim 1, further comprising a control device configured to adjust one or more properties of the first signal and the second signal to adjust the first magnetic coupling and the second magnetic coupling, respectively, wherein:
   the control device comprises selectable capacitors and inductors; and
   the control device is further configured to select one or more of the selectable capacitors and inductors to adjust the one or more properties of the first signal and the second signal.

7. The circuit of claim 1, wherein the first capacitor circuit comprises:
   a first capacitor coupled to the first inductor circuit and a first terminal of the second inductor; and
   a second capacitor coupled to the first inductor circuit and a second terminal of the second inductor.

8. A system, comprising:
   a first oscillator device, comprising:
      a first winding; and
      a first capacitance structure, wherein the first oscillator device is configured to operate at a first frequency;
   a second oscillator device, comprising:
      a second winding; and
      a second capacitance structure, wherein the second oscillator device is configured to operate at a second frequency different from the first frequency;
   a power device coupled to the first oscillator device and the second oscillator device;
   a first capacitor device configured to provide a first feedforward signal to the second oscillator device; and
   a second capacitor device configured to provide a second feedforward signal to the first oscillator device.

9. The system of claim 8, wherein the first capacitor device is coupled to the first oscillator device and is further configured to sense a first magnetic coupling generated by the first oscillator device and to provide the first feedforward signal to the second oscillator device to reduce the first magnetic coupling.

10. The system of claim 8, wherein the first capacitor device comprises:
    a first capacitor coupled to the first oscillator device and a first terminal of the second winding; and
    a second capacitor coupled to the first oscillator device and a second terminal of the second winding.

11. The system of claim 8, further comprising a control device configured to adjust one or more properties of the first feedforward signal and the second feedforward signal, wherein the one or more properties of the first feedforward signal comprises one or more of a phase and an amplitude and the control device is further configured to adjust the one or more of the phase and the amplitude to reduce a magnetic coupling generated by the first oscillator device.

12. The system of claim 8, further comprising a control device configured to adjust one or more properties of the first feedforward signal and the second feedforward signal, wherein the control device comprises a phase inverter configured to adjust a phase of the first feedforward signal, the second feedforward signal, or a combination thereof.

13. The system of claim 8, further comprising a control device configured to adjust one or more properties of the first feedforward signal and the second feedforward signal, wherein:

the control device comprises selectable capacitors and inductors; and the control device is further configured to select one or more of the selectable capacitors and inductors to adjust the one or more properties of the first feedforward signal and the second feedforward signal.

14. A method, comprising:

driving a first wire coil of a first inductor circuit using a first oscillatory driving signal at a first frequency, wherein a magnetic coupling between the first inductor circuit and a second inductor circuit corresponds to the driving of the first wire coil;

driving a second wire coil of the second inductor circuit using a second oscillatory driving signal at a second frequency different from the first frequency; and providing, from a capacitor circuit, a cancellation signal to the second inductor circuit to adjust the magnetic coupling.

15. The method of claim 14, wherein an other magnetic coupling between the second inductor circuit and the first inductor circuit corresponds to the driving of the second wire coil, and wherein the method further comprises:

providing, from an other capacitor circuit, an other cancellation signal to the first inductor circuit to adjust the other magnetic coupling; and adjusting one or more properties of the other cancellation signal to adjust the other magnetic coupling.

16. The method of claim 14, further comprising:

sensing the magnetic coupling using the capacitor circuit; and generating the cancellation signal as a feedforward signal based on the sensing of the magnetic coupling.

17. The method of claim 14, further comprising adjusting one or more properties of the cancellation signal to adjust the magnetic coupling, wherein the one or more properties of the cancellation signal comprises one or more of a phase and an amplitude, and wherein the method further comprises adjusting the one or more of the phase and the amplitude to reduce the magnetic coupling.

18. The method of claim 14, further comprising inverting a phase of the cancellation signal using a phase inverter.

19. The method of claim 14, further comprising adjusting one or more properties of the cancellation signal to adjust the magnetic coupling, wherein adjusting the one or more properties comprises selecting one or more capacitors and inductors to adjust a phase of the cancellation signal.

20. The method of claim 14, further comprising adjusting one or more properties of the cancellation signal to adjust the magnetic coupling, wherein adjusting the one or more properties comprises adjusting a current to adjust an amplitude of the cancellation signal.

* * * * *